(12) United States Patent
Bohnert et al.

(10) Patent No.: US 6,876,188 B2
(45) Date of Patent: Apr. 5, 2005

(54) ELECTRO-OPTICAL VOLTAGE SENSOR FOR HIGH VOLTAGES

(75) Inventors: Klaus Bohnert, Oberrohrdorf (CH); Andreas Frank, Zurich (CH); Hubert Brändle, Oberengstringen (CH)

(73) Assignee: ABB Research LTD, Zurich (CH)

( * ) Notice: Subject to any disclaimer, the term of this patent is extended or adjusted under 35 U.S.C. 154(b) by 0 days.

(21) Appl. No.: 10/805,517

(22) Filed: Mar. 22, 2004

(65) Prior Publication Data

US 2004/0189278 A1 Sep. 30, 2004

(30) Foreign Application Priority Data

Mar. 28, 2003 (EP) .............................. 03405213
Apr. 16, 2003 (EP) .............................. 03405271

(51) Int. Cl.[7] .............................................. G01R 19/00
(52) U.S. Cl. ........................................ 324/96; 324/72.5
(58) Field of Search ................................ 324/96, 158.1, 324/72.5, 750, 752; 356/477, 483, 487, 346; 358/12, 2; 335/496; 250/310, 311

(56) References Cited

U.S. PATENT DOCUMENTS

| 4,269,483 | A |   | 5/1981  | Feldtkeller |
|-----------|---|---|---------|-------------|
| 4,465,969 | A |   | 8/1984  | Tada et al. |
| 4,563,093 | A |   | 1/1986  | Tada et al. |
| 4,631,402 | A |   | 12/1986 | Nagatsuma et al. |
| 5,055,770 | A | * | 10/1991 | Takahashi et al. ............. 324/96 |
| 5,109,189 | A | * | 4/1992  | Smith ........................... 324/96 |
| 5,111,135 | A | * | 5/1992  | Kozuka et al. ................ 324/96 |
| 6,307,666 | B1 |  | 10/2001 | Davidson et al. |
| 2003/0034768 | A1 | | 2/2003 | Kraemmer |

FOREIGN PATENT DOCUMENTS

| DE | 197 16 477 A1 | 9/1998 |
| EP | 0 293 842 | 5/1988 |
| EP | 0682261 A2 | 4/1995 |
| EP | 0 997 738 A2 | 5/2000 |
| JP | 03249569 | 11/1991 |
| JP | 05 119075 | 5/1993 |
| JP | 10-132864 | 5/1998 |

OTHER PUBLICATIONS

J.C. Santos et al., "New Multi–Segment Pockels Device for High–Voltage Measurement", International Conference on Electrical Engineering, 1996, pp. 1366–1370, vol. 2, International Academic Publishers, Beijing, China.

Masao Ohtsuka, "Influence of Optical Rotary Power on Optical Voltage Sensor Using BGO Crystal", Electronics and Communications in Japan, Part 2, 1994, pp. 21–31, vol. 77, No. 5, Scripta Technica, Inc.

European Search Reports for corresponding EPO Applications, 03405271.2 and 03405213.4.

* cited by examiner

*Primary Examiner*—Robert Pascal
*Assistant Examiner*—Jimmy Nguyen
(74) *Attorney, Agent, or Firm*—Burns, Doane, Swecker & Mathis, L.L.P.

(57) ABSTRACT

The voltage sensor for measurement of a voltage V, which is present between two electrodes (3, 4) and generates an electric field E, comprises at least two layers (1a, 2a) made of electro-optically active material and being arranged along a light path (5). Through the layers there passes a light beam, the phase and/or state of polarization of which is influenced on account of the electro-optical effect. The orientation of the electro-optically active layers (1a, 2a) relative to the light path and the electric field E is chosen in such a way, that the influencing of the light (5) in the second layer (2a) counteracts the influencing of the light (5) in the first layer (1a). In this way, it is possible to realize a sensor with a high half wave voltage, so that high voltages V can be measured unambiguously. A plurality of first and second electro-optically active layers are advantageously arranged between the electrodes (3, 4).

14 Claims, 1 Drawing Sheet

ELECTRO-OPTICAL VOLTAGE SENSOR FOR HIGH VOLTAGES

TECHNICAL FIELD

The invention relates to the field of electro-optical voltage sensor technology. It relates to an electro-optical voltage sensor in accordance with the preamble of patent claim 1 and to a method for electro-optical voltage measurement in accordance with the preamble of patent claim 14.

PRIOR ART

Such a voltage sensor is disclosed for example in J. C. Santos, K. Hikada, "New Multi-Segment Pockels Device for High-Voltage Measurement", Proc. ICEE '96 (International Conference on Electrical Engineering), pp. 1366–1370. The sensor described by Santos and Hikada comprises a multiplicity of discs of crystalline BGO ($Bi_4Ge_3O_{12}$) which are arranged in a manner spaced apart from one another between two electrodes at which the voltage V to be measured is present. Cylindrical dielectric spacers serve to space apart the BGO discs, which are arranged at uniform distances in a row one behind the other between the electrodes. The interspaces between the BGO discs and the sensor surroundings are filled with $SF_6$.

A light beam radiates through the BGO discs, the state of polarization of which light beam changes in a manner dependent on the voltage V on account of the Pockels effect (linear electro-optical effect). In particular, two mutually orthogonally polarized light waves are coupled into the BGO crystals, which experience a phase shift dependent on the voltage V, on account of the electro-optical activity, with respect to one another. This phase shift is detected and serves as voltage signal of the sensor.

As long as the phase shift does not exceed 180°, the voltage signal is unambiguous. The corresponding maximum voltage that can be determined unambiguously is the half wave voltage $V_\pi$. The sensor is normally embodied such that the unambiguous range corresponds to a phase shift of −90° to +90°. The voltage then lies in the range of $-V_\pi/2$ to $V_\pi/2$. During the measurement of large voltages V, this half wave voltage $V_\pi$ (or $V_\pi/2$) is rapidly exceeded in the case of conventional sensors having a single electro-optically active crystal between the electrodes. The arrangement of individual thin discs of electro-optically active material as proposed by Santos and Hikada enables the total detected phase shift to be significantly reduced. In this case, the line integral over the electric field between the electrodes, which specifies the precise voltage V, is replaced by a (weighted) sum over the electric fields in the individual BGO discs. The phase shifts in each of the BGO discs, which are arranged at discrete distances from one another, contribute to the total phase shift, the half wave voltage $V_\pi$ not being exceeded even in the case of large voltages V, so that unambiguous measurement results are obtained.

SUMMARY OF THE INVENTION

It is an object of the invention to provide an alternative electro-optical voltage sensor of the type mentioned in the introduction and a corresponding alternative measurement method. The intention is to provide a voltage sensor which permits an unambiguous measurement of high voltages.

This object is achieved by means of an electro-optical voltage sensor having the features of patent claim 1 and a corresponding measurement method having the features of patent claim 14.

A voltage sensor according to the invention has two spaced-apart electrodes, between which a voltage V to be measured is present. An electric field E is generated by the voltage V present. Between the electrodes at least one first electro-optically active layer and at least one second electro-optically active layer are arranged one behind the other along a light path. Each of the two electro-optically active layers has at least two axes of birefringence, each of the axes being assigned a respective refractive index. That is to say that linearly polarized light whose direction of polarization is oriented along such an axis of birefringence "sees" the corresponding refractive index. The different refractive indices for the two axes of birefringence result in different propagation speeds of the corresponding linearly polarized waves, for which reason the jargon also talks of a fast and a slow axis (of birefringence). By virtue of the fact that the two layers are electro-optically active, there is per layer at least in each case one refractive index (and an associated axis of birefringence), which changes in a manner dependent on the electric field E. As a result of such changes in refractive index, a phase angle (phase for short) and/or a state of polarization of the light propagating along the light path can be influenced in each of said layers.

The voltage sensor according to the invention is characterized in that an orientation, defined by the corresponding axes of birefringence, of the at least one first electro-optically active layer relative to the light path and the electric field E and an orientation, defined by the corresponding axes of birefringence, of the at least one second electro-optically active layer relative to the light path and the electric field E are chosen in such a way, that the influencing of the phase and/or of the state of polarization of the light in the first layer counteracts the influencing of the phase and/or of the state of polarization of the light in the second layer.

By way of example, if linearly polarized light is coupled into the first electro-optically active layer at 45° with respect to two axes of birefringence, so that the light propagates in the electro-optically active layers in the form of two mutually orthogonally polarized light waves, then a reciprocal phase shift of these waves or a state of polarization of the light that has emerged from the layers may be measured as voltage signal. If, on the other hand, by way of example, a linearly polarized light wave is coupled into the first electro-optically active layer at 0 or 90°, so that the light propagates in both electro-optically active layers in the form of a single linearly polarized light wave, then a phase of said wave may be measured as voltage signal.

The crystallographic orientation of the electro-optically active layers is chosen in such a way that an enlarged half wave voltage $V_\pi$ of the sensor is generated. A larger half wave voltage $V_\pi$ is obtained in the sense that the half wave voltage $V_\pi$ of the sensor is larger than a half wave voltage of a sensor of identical type which differs from the sensor only by the fact that the at least one second layer is not electro-optically active.

By means of the changes in refractive index, a half wave voltage $V_\pi$ of the sensor can be defined for a light beam radiating through the electro-optically active layers. If a light beam radiates through the sensor, or more precisely: the electro-optically active layers, in a suitable manner, then the phase and/or the state of polarization of the light beam varies in a manner dependent on the electric field. A voltage signal of the sensor can be obtained from such a change in the phase and/or state of polarization of the light. On account of the wave nature of light, however, such a signal is periodic, so that, above a voltage which is characteristic of the sensor, the half wave voltage $V_\pi$, the voltage signal is ambiguous.

An unambiguous voltage measurement can take place only in the range of 0 V to $V_\pi$ (or $-V_\pi/2$ to $V_\pi/2$). If a reciprocal phase shift of two light waves is measured as the voltage signal, for example, then the unambiguous range of the phase shift, encompassing 180° (=Π in radians), is mapped onto the voltage range of 0 V to $V_\pi$ (or $-V_\pi/2$ to $V_\pi/2$). If the phase angle of a single linearly polarized light wave is measured as the voltage signal, then the unambiguous range of the alteration of the phase likewise has a magnitude of 180° (=Π in radians).

If a half wave voltage $V_\pi$ can be defined by means of the changes in refractive index and the light beam, a fundamental functioning of the voltage sensor is ensured. Various preconditions which are familiar and known to the person skilled in the art, for example with regard to the electric field E, the light (light path, polarization) and with regard to the reciprocal arrangement thereof, are thus fulfilled.

In addition to the orientation of the electro-optically active layers, it is also possible to choose their effective layer thicknesses and also the type of material which the layers comprise or consist of in order to achieve a desired half wave voltage.

In the sensor, a light beam is radiated into the electro-optically active layers, which light beam is influenced in the electro-optically active layers in a manner dependent on the electric field and is then detected. A voltage signal is then obtained from the light detected after passing through the layers. The influencing experienced by the light in the at least one first electro-optically active layer is partially reversed again, that is to say partly compensated for, in the at least one second electro-optically active layer. As a result, a voltage signal of identical magnitude is achieved only in the case of a higher voltage V, so that a larger half wave voltage $V_\pi$ results.

The simplest case is to take two layers made of the same material, for example BGO, the first BGO layer being somewhat thinner than the second BGO layer, measured along a coordinate defined by the distance between the two electrodes. Light radiates through the layers along precisely this coordinate. In this case, the crystalline BGO layers are oriented with respect to one another such that, in the preferred case, the [001] directions of the crystals are oriented antiparallel to one another, while the [010] directions are oriented parallel and the [100] directions antiparallel (or, alternatively, the [010] directions are oriented antiparallel and the [100] directions parallel) to one another. In the case of identical layer thicknesses, the electro-optically induced influences on the light in the first and in the second layer would precisely cancel one another out since they would be not only opposite but also of identical magnitude.

An electro-optically active material (electro-optical crystal) has two axes of birefringence which are relevant to a light beam interrogating the crystal (depending on the electrode geometry, the light path and the crystal geometries). Said axes are oriented (pairwise) perpendicular to one another. An electric field generated in a suitable manner leads to a change in the birefringence with regard to said axes. That is to say that, for at least one of said axes, the refractive index assigned to it changes in a manner dependent on the field E. A reciprocal orientation according to the invention of the electro-optically active layers can be defined well by means of the reciprocal relative orientation of said two axes of birefringence.

The reciprocal orientation of the electro-optically active layers is chosen in such a way that the effect, which the electric field has in the first electro-optically active layer on a light beam scanning the at least two electro-optically active layers, is compensated for or cancelled in part by the effect, which the electric field has in the second electro-optically active layer on the light beam scanning the at least two electro-optically active layers. To formulate it differently, the signs of said effects in the two electro-optically active layers are mutually opposite. Since phase shifts of the light always take place as a result of the electro-optical effect, a sign of such an effect can always be defined.

A sensor according to the invention has the advantage that it still supplies unambiguous voltage signals even in the case of large voltages. Reliable measurements in the high-voltage range (typically 100 kV to 1000 kV) are thus possible. Moreover, it is possible to realize such a sensor which has only very low reflection losses.

In an advantageous embodiment, the two layers have the same crystal symmetry, and the layers are oriented in such a way, that the crystalline orientation of the second layer results from the crystalline orientation of the first layer by means of a rotation of the first layer through 180° about one of the axes of birefringence of the first layer. This permits a relatively simple interpretation of the voltage signals to be achieved.

The layers may advantageously comprise the same material. Reflections at interfaces between different layers are thus minimized.

In a particularly preferred embodiment, the layers comprise the same material and are arranged with said crystalline orientation (rotated through 180° relative to one another about an axis of birefringence) and have effective layer thicknesses $\delta_1$, $\delta_2$ which differ from one another. The half wave voltage $V_\pi$ of the sensor may be chosen by way of the difference between the layer thicknesses $\delta_1$, $\delta_2$.

In a particularly advantageous manner, a plurality of first and second layers arranged pairwise are arranged between the electrodes. It is thereby possible to achieve a precise voltage measurement that is insensitive toward external disturbances of the field distribution.

In particular, the plurality of first and second electro-optically active layers arranged pairwise may be arranged between the electrodes in such a way that a deviation of the voltage determined by means of the voltage sensor from the voltage V to be measured is minimal. Thus, a deviation of the voltage signal of the sensor, that is to say of the voltage determined by means of the voltage sensor, from the voltage V to be measured is then below a predeterminable limit. Such an arrangement of the layers can be determined for example by means of approximation calculations or simulations. It is possible to obtain particularly accurate measurements and a high degree of insensitivity toward external disturbances of the electric field, for example on account of rain or snow in proximity to the sensor, and with respect to transverse fields, for example on account of adjacent electrical phases near the sensor.

A further advantageous embodiment is characterized in that the layers are arranged in stack form between the electrodes, the first layer and the last layer in the stack being in contact with a respective one of the two electrodes. In particular, the stack may advantageously be configured in essentially cylindrical fashion. The layers preferably form a sensor rod. A mechanically stable construction having high dielectric strength is thus realized.

In a particularly advantageous manner, the sensor may also be configured in such a way, that it supplies a voltage signal which is essentially independent of temperature. This is realized by means of a suitable choice of the materials of the layers arranged between the electrodes and of the effective layer thicknesses thereof. The respective influences of material constants, such as relevant electro-optical coefficient (k), dielectric constant ($\in$) and thermal expansion coefficient ($\alpha$), on the temperature dependence of the voltage signal may be chosen in such a way, that the resulting entire temperature dependence of the voltage signal essentially vanishes. The voltage signal is generally obtained from the detected phase and/or the detected state of polarization of the light.

In an advantageous manner, in particular in combination with said temperature compensation, it is also possible to arrange one or several non-electro-optically active distance layers between the electrodes. This obtains further degrees of freedom for the sensor design.

A particularly advantageous embodiment is characterized in that the layers consist of crystalline BGO (bismuth germanium oxide, $Bi_4Ge_3O_{12}$), the BGO in the first and second layer being oriented with its [001] direction parallel and antiparallel, respectively, to the direction of propagation of the light, and the direction of propagation of the light essentially running along the electric field E generated by the voltage V. In this case, the [110] directions of the crystals are advantageously oriented essentially parallel or antiparallel.

In a particularly advantageous manner, the electrodes together with the layers arranged between the electrodes may be cast in silicone. By virtue of the silicone sheathing, it is possible to produce a sensor having very small dimensions and a low weight, which sensor nevertheless has a sufficient electrical insulation. Expensive, large, heavy insulation tubes, typically made of glass-fiber-reinforced plastic, can be avoided. The low weight and the small dimensions enable the sensor to be used at locations or in positions, at or in which conventionally insulated sensors cannot be used. For example suspended from a high-voltage-carrying installation part.

The sensor is advantageously designed for measurement of voltages V, which are less than or equal to a maximum voltage $V_{max}$ to be measured, the number and orientation of the first and second layers and the effective layer thicknesses thereof and the materials which the layers comprise being chosen in such a way, that $V_{max}$ is less than or equal to the half wave voltage $V_\pi$ of the sensor.

The method according to the invention for measurement of an electrical voltage V, the voltage V being present between two electrodes arranged in a manner spaced apart from one another and generating an electric field E, at least one first electro-optically active layer being arranged between the electrodes and being traversed by a light beam, the phase and/or state of polarization of which is influenced by the electric field E in the first layer, and at least one second electro-optically active layer being arranged between the electrodes and being traversed by the light beam, the phase and/or state of polarization of which is influenced by the electric field in the second layer, is characterized in that the influencing experienced by the light beam in the at least one first layer is partially cancelled by the influencing experienced by the light beam in the at least one second layer.

Further preferred embodiments and advantages emerge from the dependent patent claims and the figures.

BRIEF DESCRIPTION OF THE DRAWINGS

The subject matter of the invention is explained in more detail below using preferred exemplary embodiments illustrated in the accompanying drawings, in which.

Figure 1:
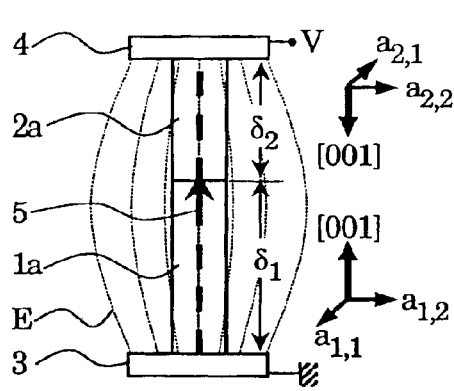
FIG. 1 shows a voltage sensor according to the invention, highly diagrammatically, with crystal orientations indicated.

The reference symbols used in the drawings and their meaning are summarized in the list of reference symbols. In principle, identical or at least identically acting parts are provided with the same reference symbols in the figures. The exemplary embodiments described represent the subject matter of the invention by way of example and have no restrictive effect.

WAYS OF EMBODYING THE INVENTION

On Mar. 28, 2003, the same applicant filed at the European Patent Office an as yet unpublished patent application by the same inventor with the application number 03405213.4 and title "Temperature-compensated electro-optical voltage sensor". This EP application is hereby expressly incorporated with its entire disclosure content in the present patent application. It discloses voltage sensors, methods and details, the full scope of which is intended to be part of the present patent application.

Principles and details concerning electro-optical voltage measurement can be gathered from the prior art, for example the cited EP 0 682 261 A2. The disclosure content of this document is hereby expressly incorporated in the description. Further principles of electro-optical voltage measurement and detection can be gathered for example from the publication G. A. Massey, D. C. Erickson and R. A. Kadlec, Applied Optics 14, 2712–2719, 1975. The disclosure content of this text is hereby expressly incorporated in the description.

FIG. 1 shows a voltage sensor according to the invention in a highly diagrammatic manner. Two layers 1a, 2a made of electro-optically active material, advantageously BGO layers, are arranged between two electrodes 3, 4, between which a voltage V to be measured is present. The voltage V generates an electric field E. The layer thickness of the first layer 1a is $\delta_1$ and the layer thickness of the second layer 2a is $\delta_2$. A light beam 5 radiates through both layers 1a, 2a. Details concerning the properties of the light 5, its generation and detection can be gathered from the cited unpublished EP application.

The two electro-optically active layers 1a, 2a are formed as cylindrical elements which together form a sensor rod extending from one electrode 3 to the other electrode 4. The total length of the sensor rod thus in this case corresponds to an electrode distance L. Thus, $\delta_1+\delta_2=L$ holds true here. The crystalline orientation of the two BGO layers 1a, 2a is illustrated on the right next to the sensor in FIG. 1. The [001] directions (along which here the light 5 propagates, and which are equivalent to [010] and [100] on account of the crystal symmetry) are oriented antiparallel to one another and point along a coordinate which is predetermined by the electrodes 3, 4 (or their distance) and along which the axis of the sensor rod is also oriented. Two axes of birefringence of the first electro-optically active layer 1a which are relevant to the sensor are designated by $a_{1,1}$ and $a_{1,2}$. Analogously, two axes of birefringence of the second electro-optically active layer 2a which are relevant to the sensor are designated by $a_{2,1}$ and $a_{2,2}$. For BGO, these axes of birefringence correspond to the [110] and [1̄10] crystal directions. The relative crystalline orientation of the two layers $1a$, $2a$ is such that the crystalline orientation of the second layer $2a$ results from the crystalline orientation of the first layer $1a$ by means of a rotation of the first layer $1a$ through 180° about one of the axes of birefringence $a_{1,1}$ or $a_{1,2}$ (corresponding to [110] or [1̄10]).

The corresponding axes $a_{1,1}$ and $a_{2,1}$ of the first and second layer, respectively, are oriented parallel to one another, as are the corresponding axes $a_{1,2}$ and $a_{2,2}$. The crystal directions running parallel to the axes are oriented antiparallel to one another in the first case ($a_{1,1}$ and $a_{2,1}$), and parallel in the second case ($a_{1,2}$ and $a_{2,2}$).

Said axes $a_{i,1}$ and $a_{i,2}$, where the index i indicates the corresponding electro-optically active layers, are referred to as axes of birefringence which are "relevant to the sensor", because at least one refractive index $n_{i,1}$ and $n_{i,2}$ assigned to one of the axes changes in a manner dependent on the electric field E in each of the layers. In this case, the light beam 5 radiating through the layers $1a$, $2a$ experiences an electro-optically engendered influencing. This influencing is generally detected as an altered state of polarization or as an altered phase angle of the light 5.

The crystal directions, to which a pair of birefringence axes relevant to the sensor corresponds, depend on the crystal symmetry and the direction of light propagation and the direction of the electric field E. A functional sensor has such a pair of axes of birefringence in at least two, advantageously all of the, electro-optically active layers.

The arrangement of the crystal orientations of the layers $1a$, $2a$ as illustrated in FIG. 1 results in partial compensation of the influencing experienced by the light 5 in the first and second layers. If the light properties and the coupling-in of the light are configured as described further below in connection with FIG. 3, the two mutually orthogonally polarized light waves, of which the light beam 5 is composed, experience in the first layer $1a$ a phase shift with respect to one another of $$\Gamma_1 = k_1 \cdot E \cdot \delta_1 \cdot 2\Pi/\lambda,$$

and, in the second layer $2a$ a phase shift with respect to one another of $$\Gamma_2 = k_2 \cdot E \cdot \delta_2 \cdot 2\Pi/\lambda,$$

wherein $\lambda$ is the wavelength of the light 5 and $k_1$, $k_2$ are applicable or relevant electro-optical coefficients of the materials, which the first and second layer, respectively, comprise. Here, they are of opposite and identical magnitude:

$$k_1 = -k_2 = n_0^3 r_{41},$$

because the two layers $1a$, $2a$ are made of the same material and the crystals are oriented with respect to one another in the abovementioned manner (rotated 180° relative to one another about axis of birefringence), where $n_0$ is the refractive index of BGO for a vanishing electric field (E=0) and $r_{41}$ is the relevant electro-optical tensor element for crystalline BGO (in the orientation of the first layer $1a$). In the case of BGO and for the crystal orientation considered, it holds true that $n_{i,1} = n_0 + (\frac{1}{2})k_1 \cdot E$ and $n_{i,2} = n_0 - (\frac{1}{2})k_1 \cdot E$.

Consequently, one finds for a total phase shift $\Gamma$ being present between the mutually orthogonally polarized light waves after passing through the two layers $1a$, $2a$:

$$\Gamma = k_1 \cdot E \cdot (\delta_1 - \delta_2) \cdot 2\Pi/\lambda.$$

It can be seen from this that, by means of the choice of the layer thicknesses $\delta_1$, $\delta_2$, the magnitude of the total phase shift $\Gamma$ can be reduced compared to the individual phase shifts $\Gamma_1$, $\Gamma_2$ in the layers $1a$, $2a$ or the sum thereof. The total phase shift $\Gamma$ as a voltage signal can thus be scaled down.

A numerical example for illustration: if, by way of example, only the first layer $1a$ were electro-optically active and the second layer $2a$ had no electro-optical activity (given otherwise identical properties), then given a voltage V of V=10 kV, for example, the total phase shift might be $\Gamma = \Gamma_1 = 180°$. The half wave voltage of the sensor would then be 10 kV; no phase shift occurs in the second layer in this case. If, however, according to the invention, the second layer is electro-optically active and is formed in the manner illustrated in FIG. 1, the half wave voltage will be larger. By way of example, if $\delta_2 = 0.9 \cdot \delta_1$ is chosen, the total phase shift $\Gamma$ given the abovementioned V=10 kV, is precisely $\Gamma = (1-0.9) \cdot 180° = 18°$, so that the half wave voltage is 100 kV instead of 10 kV. In this way, the half wave voltage $V_\pi$ and thus the voltage range in which unambiguous voltage signals can be obtained can be increased by arbitrary factors.

Compared with the case if no second layer were present and the entire electrode distance L were bridged with a single BGO crystal as sensor rod, it is possible, of course, to obtain an even greater increase in the half wave voltage $V_\pi$ through the arrangement of two correspondingly oriented crystals or layers.

Figure 2:
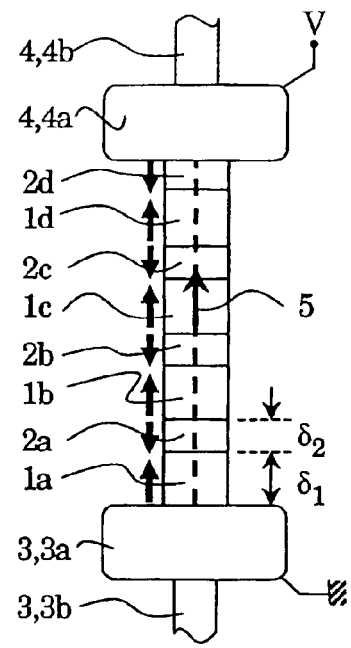
FIG. 2 shows a voltage sensor according to the invention with four pairs of first and second electro-optically active layers, diagrammatically.

FIG. 2 illustrates a particularly advantageous embodiment of the invention. In this case, rather than just a single pair of two electro-optically active layers $1a$, $2a$, a plurality (namely four) of first and second electro-optically active layers $1a$, $1b$, $1c$, $1d$, $2a$, $2b$, $2c$, $2d$ are arranged between the electrodes 3, 4. Said layers are advantageously arranged pairwise, so that first and second layers are always arranged one behind the other in the light path 5 and even adjoin one another here. The sensor rod thus comprises a stack of first and second layers arranged alternately. The crystalline orientation of the layers $1a$, $1b$, $1c$, $1d$, $2a$, $2b$, $2c$, $2d$ is advantageously chosen in the manner specified in FIG. 1. The thick arrows on the left next to the sensor rod illustrate the [001] direction. In this case, the mutually corresponding axes of birefringence of different pairs are oriented either parallel or antiparallel to one another. The layer thicknesses $\delta_1$, $\delta_2$ are chosen to be identical here for all the first and second layers, respectively. In FIG. 2, the electrodes 3, 4 have field control electrodes $3a$, $4a$ and voltage feeds $3c$, $4c$.

The pairwise arrangement of a plurality of first and second electro-optically active layers $1a$, $1b$, $1c$, $1d$, $2a$, $2b$, $2c$, $2d$ makes it possible to achieve a more precise voltage measurement and a significantly reduced interference susceptibility toward external disturbances of the field distribution. Each layer may have its own layer thickness ($\delta_1^{(a)}$, $\delta_2^{(a)}$, $\delta_1^{(b)}$, $\delta_2^{(b)}$ ...), which may differ from the other layer thicknesses. The cited unpublished EP application describes ways of optimizing the arrangement in such a way, that the deviation of the measured voltage from the voltage V to be measured is minimized. Details about this are specified in the patent U.S. Pat. No. 4,939,447 and in the publication Optics Letters 14, 290, 1989. The disclosure content of these texts is hereby expressly incorporated in the description.

Each layer pair supplies a partial voltage signal which is a measure of the electric field prevailing in the region of the relevant layer pair. All the pairs are advantageously scanned by a single light beam 5.

Figure 3:
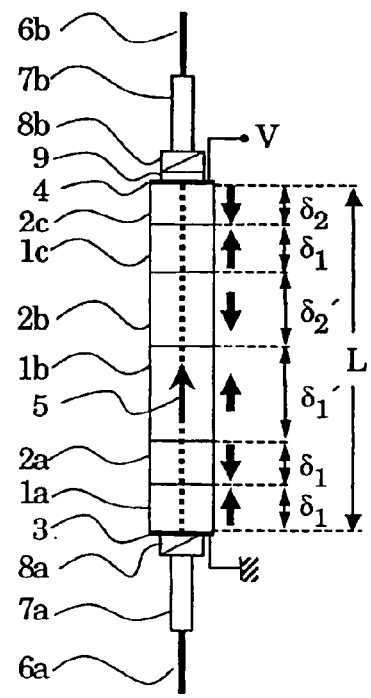
FIG. 3 shows a voltage sensor according to the invention in transmission geometry, with three pairs of first and second electro-optically active layers, diagrammatically.

FIG. 3 diagrammatically shows a voltage sensor, in particular the optical components of the sensor being illustrated. The reference symbols can be gathered from the list of reference symbols. Further details can be gathered from the cited unpublished EP application: the sensor illustrated in FIG. 1 therein is identical to the sensor illustrated here in FIG. 3 except for the sensor rod.

The sensor rod of the sensor illustrated in FIG. 3 comprises three pairs of first and second layers 1a, 1b, 1c, 2a, 2b, 2c. The thick arrows on the right next to the sensor rod illustrate the crystalline orientation of the layers, analogously to FIGS. 1 and 2. Not all the first layers 1a, 1b, 1c and not all the second layers 2a, 2b, 2c have the same layer thicknesses. The central layer pair 1b, 2b has layer thicknesses $\delta_1'$ and $\delta_2'$, respectively, which are twice as large as the corresponding layer thicknesses $\delta_1$ and $\delta_2$, respectively, of the other layers 1a, 1c, 2a, 2c.

The electric field which is relevant to the phase shift or change in polarization experienced by the light 5 in a layer pair is the field at the location of the layer pair. In principle, the total thickness of each layer pair may be chosen freely, so that the voltage V to be measured is approximated by a sum of partial signals which are generated at the in principle freely selectable locations of the layer pairs. By virtue of a layer thickness difference between the first and second layers of the respective layer pair which can be chosen practically freely and individually for each layer pair, said sum of partial signals can be weighted almost arbitrarily. It is thereby possible to optimize a sensor construction for a given field profile, so that precise measurement results can be obtained.

The exemplary embodiments illustrated are in transmission geometry. It is also possible, of course, to operate a sensor in reflection geometry. By way of example, FIGS. 4 and 5 of the cited unpublished EP application illustrate sensor constructions in possible reflection geometries.

Figure 4:
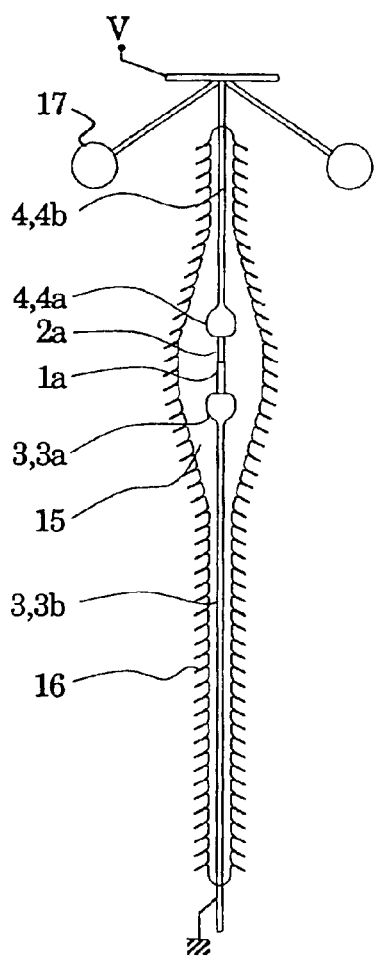
FIG. 4 shows a voltage sensor according to the invention with a silicone sheathing, diagrammatically.

FIG. 4 shows a further advantageous embodiment of the sensor. It is characterized in that the essential parts, in particular the field control electrodes 3a, 4a and the sensor rod, are sheathed with silicone 15. Further details about this embodiment can be gathered from the cited unpublished EP application, FIG. 8 of which corresponds to FIG. 4 except for the differently configured sensor rod.

Further advantageous embodiments can be gathered from the cited unpublished EP application, in particular FIGS. 6 and 7 therein. In this case, it is possible of course, to take account of a sensor rod corresponding to the present invention.

The alternative or additional features presented further above and below are optional and can be combined arbitrarily among one another and also with the exemplary embodiments mentioned in the description.

As illustrated in connection with FIGS. 2 and 3, a plurality of pairs of first and second layers are advantageously manifested. Preferably, all the pairs are interrogated by the same one light beam 5. However, it is also possible to provide a plurality of light beams, one light beam in each case interrogating at least one pair of first and second layers. The light path 5 may also have optical means such as reflection means and optical fibers by means of which the light is guided before, between or after passing through layers arranged between the electrodes.

In an advantageous manner, as described above, the light beam 5 and the electric field E run parallel to a high symmetry axis of the crystal. The birefringence axes $a_{i,1}$, $a_{i,2}$ thus advantageously correspond to high symmetry axes of the crystal. In the case of cubic crystals such as BGO, as described above, the light beam 5 and the electric field E preferably run along the [100] direction or an equivalent crystal direction ([010], [001]). This has the advantage that field components which are orthogonal to this direction have no influence on the state of polarization or the phase of the light 5 (low susceptibility to interference). If the [100] direction does not run along the light beam 5 and the field to be measured, field components which are orthogonal to the field to be measured also influence the state of polarization or the phase of the light 5. Moreover, a different orientation will generally lead to a voltage signal which is more complicated to evaluate. Thus, as described above, high symmetry axes of the crystal and the light path 5 and the electric field E are preferably oriented essentially parallel or perpendicular to one another. However, the high symmetry axes of the electro-optically active layers may form, with the direction of light propagation and/or with the direction of the electric field, an angle that differs from 0° and a multiple of 90°. Equally, however, the angle formed by the direction of light propagation and the direction of the electric field may also differ from 0° and a multiple of 90°. Details about the dependence of the electro-optical effect in arbitrary crystals on the field direction and the direction of light propagation can be gathered for example from the book by J. F. Nye: "Physical Properties of Crystals", Oxford University Press, 1957 or other works on crystal optics. It is thus possible for the person skilled in the art to realize a voltage sensor according to the invention with a wide variety of angles.

The formulation "crystalline orientation" is used here generally to mean the orientation of the electro-optically active layers which is defined by the relevant axes of birefringence $a_{i,1}$, $a_{i,2}$. Although electro-optically active materials are, in practice, always of a crystalline structure, it is conceivable that an electro-optical activity of the type considered here is present or can be induced in noncrystalline materials (such as, for example, gases, liquids, noncrystalline solids), in which case although these materials do not then have crystal axes, they do have axes of birefringence.

It goes without saying that the temperature compensation discussed in detail in the cited unpublished EP application can also be combined with the present invention. Such a temperature compensation can be achieved by means of a corresponding choice of the layer thicknesses and the materials of the layers. In particular, it is possible to use, layer pair by layer pair or in each case for the first layer and for the second layer alternately, a crystal with a positive and a crystal with a negative temperature dependence of its respective applicable electro-optical coefficient and a suitable temperature dependence of the dielectric constant. The published patent application EP 0 682 261 A2 specifies various suitable electro-optically active materials. The disclosure content of this document is hereby expressly incorporated in the description. The arrangement of one or a plurality of non-electro-optically active layers between the electrodes 3, 4 is not absolutely necessary.

Since the number of free parameters in the design of a sensor which is both temperature-compensated and has a half wave voltage increased according to the invention is small, various electro-optically active materials are advantageously used for this purpose for the various layers, since these have correspondingly differently temperature-dependent material constants. It is also advantageously possible to arrange non-electro-optically active distance layers (corresponding to the "distance medium" in the cited unpublished EP application) in the sensor rod, which then make a corresponding contribution to the temperature compensation. By way of example, fused silica is suitable for such a distance layer. Preferably, such an intermediate layer is arranged between two pairs of first and second layers, but it may also be arranged within a layer pair. In such a case, the sum of all the layer thicknesses of first and second electro-optically active layers will be less than the electrode distance L.

In accordance with general linguistic usage, in the present application, too, electro-optical activity is understood to be an electric-field-dependent change in birefringence in a usually crystalline material. The effect may be linear (pockels effect) or else have other dependences on the electric field strength, for example a quadratic one. An electro-optically active material may be birefringent or else non-birefringent at E=0 (vanishing electric field). Birefringence means that, for two mutually orthogonal axes (of birefringence), there are two different refractive indices which are "experienced" by light waves whose polarization is orientated along such an axis. A change in birefringence may mean that only one refractive index assigned to an axis of birefringence changes or that two such refractive indices change differently, in which case this last may happen as a result of an increase in one refractive index with a simultaneous decrease in the other refractive index or else as a result of a differently intense change in refractive index with the same sign.

The longitudinal pockels effect (direction of light propagation essentially parallel to the electric field) has always been utilized in the exemplary embodiments. However, it is also possible, in principle, to utilize the transverse pockels effect (direction of light propagation essentially perpendicular to the electric field) and to construct a corresponding sensor depending on the type of electro-optically active material and the crystalline orientation thereof. In principle, the arrangement of the electro-optically active layers between the electrodes 3, 4 may be arbitrary. In the case of the longitudinal pockels effect, the arrangement chosen in the exemplary embodiments is advantageously chosen, so that the light path 5 runs parallel to the electric field E, and that the electro-optically active layers are arranged one behind the other along the electrode distance (along the electric field E). In the case of the transverse pockels effect the layers may likewise be arranged in this way, optical means such as mirrors or glass fibers then being manifested, by means of which the light beam 5, after emerging from a first layer 1*a*, can be coupled into a second layer 2*a*, because the light beam 5 propagates essentially perpendicular to the sensor rod within the layers. In such a case, the two layers may also be oriented precisely identically relative to one another or even be the same crystal, their relative orientation with respect to the light path 5 (more precisely: with respect to the direction of light propagation prescribed by the light path 5 in the respective layer) naturally being different. As an alternative, it is also possible, with the direction of propagation being maintained, to rotate the direction of polarization through 90°. In an alternative arrangement, in the case of the transverse pockels effect, a first and a second layer (if appropriate a plurality in each case pairwise) are arranged next to one another with respect to the electrode distance, so that no optical means are necessary in order to guide the light 5 from the first into the second layer. The pairwise interrogation of layers by means of a plurality of light beams 5 is particularly appropriate in this case. In most geometries, a sensor based on the transverse pockels effect has a large transverse sensitivity, however (influencing by external fields which do not have the same orientation as the field to be measured).

In the exemplary embodiments of the figures, the effective distance L between the electrodes 3, 4 is the geometrical length covered by the light 5 between the electrodes 3, 4. L thus corresponds to the minimum geometrical distance between the electrodes 3, 4. However, by way of example, the effective distance L may differ from the geometrical distance between the electrodes when the field electrodes 3*a*, 4*a* have a bent profile in the radial direction, so that the minimum geometrical distance between the field electrodes 3*a*, 4*a* is smaller in the radial outer region than in the radial inner region, where the transparent parts of the electrodes 3, 4 are arranged. In the case also of electrodes 3, 4 not oriented parallel to one another, the geometrical minimum distance between the electrodes would generally not correspond to the effective distance L between the electrodes 3, 4. The effective distance L between the electrodes 3, 4 may depend on the light guidance.

In the exemplary embodiments, the effective layer thicknesses correspond to the geometrical thickness of the individual layers. By way of example in the case of uneven layer surfaces or if the layers are not formed in plane-parallel fashion, a geometrical layer thickness is not regularly defined. The term "effective layer thickness" was therefore introduced. Further explanations may be gathered from the cited unpublished EP application.

Although the first and second layers advantageously extend from one electrode 3 to the other electrode 4, other layers (also gas, liquids, vacuum) may also be arranged between the layers or between the layers and one or both electrodes. The arrangement of the electro-optically active layers "between the electrodes 3, 4" means that the layers are permeated by the electric field E.

Further variants and options can be gathered from the overall consideration of the present application and the cited unpublished EP application.

The features mentioned may be advantageous jointly or else individually or in any desired combination.

List of Reference Symbols

1*a*,1*b*, . . . First electro-optically active layer, first BGO crystal
2*a*, 2*b* . . . Second electro-optically active layer, second BGO crystal
3 Electrode
3*a* Field control electrode
3*b* Voltage feed
4 Electrode
4*a* Field control electrode
4*b* Voltage feed
5 Light, light beam, light path
6*a* Optical feed fiber
6*b* Optical return fiber
7*a*, 7*b* Collimator lens
8*a*, 8*b* Polarizer
9 λ/4 element
15 Silicone
16 Lamellae (shielding)
17 Corona ring
$a_{i,1}$, $a_{i,2}$ Axes of birefringence of the i-th electro-optically active layer
$k_1$ applicable electro-optical coefficient of the material of a first layer
$k_2$ applicable electro-optical coefficient of the material of a second layer
$n_{i,1}$, $n_{i,2}$ Refractive index, assigned to an axis of birefringence of the i-th electro-optically active layer
E Electric field, field line
L Effective electrode distance
V Electrical voltage to be measured
$V_\pi$ Half wave voltage
$\delta_1$, $\delta_1'$ Effective layer thickness of a first electro-optically active layer
$\delta_2$, $\delta_2'$ Effective layer thickness of a second electro-optically active layer
$\Gamma$, $\Gamma_1$, $\Gamma_2$ Phase shift

What is claimed is:

1. An electro-optical voltage sensor for measurement of an electrical voltage V, the voltage V being present between two electrodes arranged spaced apart and generating an electric field E, wherein between the electrodes at least one first electro-optically active layer and at least one second electro-optically active layer are arranged one behind the other along a light path, each of said layers having two axes of birefringence $a_{i,1}$, $a_{i,2}$, which are respectively assigned a refractive index $n_{i,1}$, $n_{i,2}$, and, in each of said layers it being possible to alter at least in each case one of said refractive indices, $n_{i,1}$, by means of the electric field E, as a result of which a phase and/or a state of polarization of the light can be influenced in each of said layers the index I=1,2 indicating the first and second electro-optically active layer, respectively, an orientation, defined by the axes of birefringence $a_{1,1}$, $a_{1,2}$, of the at least one first electro-optically active layer relative to the light path and the electric field E and an orientation, defined by the axes of birefringence $a_{2,1}$, $a_{2,2}$, of the at least one second electro-optically active layer relative to the light path and the electric field E are chosen in such a way, that the influencing of the phase and/or of the state of polarization of the light in the first layer counteracts the influencing of the phase and/or of the state of polarization of the light in the second layer.

2. The voltage sensor as claimed in claim 1, it being possible for a half wave voltage $V_\pi$ of the voltage sensor to be defined by means of the alterations of the refractive indices $n_{i,1}$ for a light beam propagating along the light path, wherein the orientation, defined by the axes of birefringence $a_1$, $a_1$, of the at least one first electro-optically active layer relative to the light path and the electric field E and the orientation, defined by the axes of birefringence $a_{1,1}$, $a_{1,2}$, of the at least one second electro-optically active layer relative to the light path and the electric field E are chosen in such a way, that the half wave voltage $V_\pi$ of the sensor is greater than in the case of a sensor of identical type which, instead of the at least one second electro-optically active layer, has at least one comparison layer which is not electro-optically active but is otherwise of identical type to the at least one second electro-optically active layer.

3. The voltage sensor as claimed in claim 1, wherein the orientation, defined by the axes of birefringence $a_{1,1}$, $a_{1,2}$, of the at least one first electro-optically active layer relative to the light path and the electric field E and the orientation, defined by the axes of birefringence $a_{2,1}$, $a_{2,2}$, of the at least one second electro-optically active layer relative to the light path and the electric field E, and the materials of the layers arranged between the electrodes, and the effective layer thicknesses thereof are chosen in such a way, that the influencing of the phase and/or of the state of polarization of the light in the first layer partially compensates for the influencing of the phase and/or of the state of polarization of the light in the second layer.

4. The voltage sensor as claimed claim 1, wherein the first layer and the second layer have the same crystal symmetry, and wherein the layers are arranged in such a way that the crystalline orientation of the second layer results from the crystalline orientation of the first layer by means of a rotation of the first layer through 180° about one of the axes of birefringence $a_{1,1}$ or $a_{1,2}$.

5. The voltage sensor as claimed in claim 1, wherein the first electro-optically active layer consists of the same material as the second electro-optically active layer.

6. The voltage sensor as claimed in claim 4, wherein the at least one first electro-optically active layer is arranged with an effective layer thickness δ1 and the at least one second electro-optically active layer is arranged with an effective layer thickness δ2 between the two electrodes where δ1≠δ2 holds true.

7. The voltage sensor as claimed in claim 1, wherein a plurality of first and second electro-optically active layers arranged pairwise are arranged between the electrodes along the light path.

8. The voltage sensor as claimed in claim 7, wherein the plurality of first and second electro-optically active layers arranged pairwise are arranged between the electrodes in such a way, that a deviation of the voltage determined by means of the voltage sensor from the voltage V to be measured is minimal.

9. The voltage sensor as claimed in claim 1, wherein the at least one first electro-optically active layer and the at least one second electro-optically active layer or the plurality of first and second electro-optically active layers arranged pairwise are arranged in stack form between the electrodes the first layer and the last layer in the stack being in contact with a respective one of the two electrodes, in particular the stack being configured in essentially cylindrical fashion.

10. The voltage sensor as claimed in claim 1, wherein it is possible to detect the phase and/or the state of polarization of the light after emergence from the second electro-optically active layer, it being possible to determine a voltage signal from the detected phase and/or the detected state of polarization, the materials of layers arranged between the electrodes and the effective layer thicknesses thereof being chosen in such a way, that temperature influences on the detected phase and/or the detected state of polarization are essentially compensated for.

11. The voltage sensor as claimed in claim 1, wherein at least one distance layer made of a non-electro-optically active material is arranged between the electrodes.

12. The voltage sensor as claimed in claim 1, wherein the at least one first electro-optically active layer is crystalline BGO which runs with its direction essentially along one coordinate defined by the distance between the two electrodes, and the at least one second electro-optically active layer is crystalline BGO whose direction is oriented essentially oppositely to the direction of the at least one first electro-optically active layer, and the directions of the at least two layers being oriented essentially parallel or anti-parallel to one another, and in particular the light path in the at least one first electro-optically active layer and in the at least one second electro-optically active layer essentially running along one of said directions.

13. The voltage sensor as claimed in claim 1, wherein at least the electrodes together with the at least one first electro-optically active layer and the at least one second electro-optically active layer are sheathed with silicone.

14. A method for measurement of an electrical voltage V, the voltage V being present between two electrodes arranged in a manner spaced apart from one another and generating an electric field E, at least one first electro-optically active layer being arranged between the electrodes through which layer there passes a light beam, the phase and/or state of polarization of which is influenced by the electric field E in the first layer, and at least one second electro-optically active layer being arranged between the electrodes, through which layer there passes the light beam, the phase and/or state of polarization of which is influenced by the electric field E in the second layer, wherein the influencing experienced by the light beam in the at least one first layer is partially cancelled by the influencing experienced by the light beam in the at least one second layer.

* * * * *